(12) United States Patent
Chen et al.

(10) Patent No.: US 8,649,236 B2
(45) Date of Patent: *Feb. 11, 2014

(54) CIRCUIT AND METHOD FOR CONTROLLING LEAKAGE CURRENT IN RANDOM ACCESS MEMORY DEVICES

(75) Inventors: Chung Zen Chen, Hsinchu (TW); Ying Wei Jan, Hsinchu (TW); Jian Shiang Liang, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 218 days.

This patent is subject to a terminal disclaimer.

(21) Appl. No.: 13/105,274

(22) Filed: May 11, 2011

(65) Prior Publication Data

US 2012/0287739 A1 Nov. 15, 2012

(51) Int. Cl.
*G11C 7/00* (2006.01)

(52) U.S. Cl.
USPC ........... 365/203; 365/222; 365/227; 365/228; 365/229

(58) Field of Classification Search
USPC .......................... 365/203, 222, 227, 228, 229
See application file for complete search history.

(56) References Cited

U.S. PATENT DOCUMENTS

| | | | |
|---|---|---|---|
| 2003/0043673 A1* | 3/2003 | Hashimoto et al. | 365/222 |
| 2003/0058020 A1* | 3/2003 | Kitagawa et al. | 327/308 |
| 2006/0215479 A1* | 9/2006 | Lee | 365/230.06 |
| 2008/0298152 A1* | 12/2008 | Ito et al. | 365/222 |

* cited by examiner

*Primary Examiner* — Huan Hoang
*Assistant Examiner* — Jay Radke
(74) *Attorney, Agent, or Firm* — Stites & Harbison PLLC; Juan Carlos A. Marquez, Esq.

(57) ABSTRACT

A circuit for controlling leakage current in random access memory devices comprises a pre-charge equalization circuit. The pre-charge equalization circuit provides a pre-charge voltage to a pair of complementary bit lines of a memory cell of a random access memory device in accordance with a pre-charge signal. When the memory cell is in a self-refresh mode, the pre-charge signal is activated by a periodically triggered pre-charge request and also activated before and after the memory cell is self-refreshed.

15 Claims, 7 Drawing Sheets

CIRCUIT AND METHOD FOR CONTROLLING LEAKAGE CURRENT IN RANDOM ACCESS MEMORY DEVICES

BACKGROUND OF THE INVENTION

1. Field of the Invention

The present invention relates to a circuit and a method for controlling leakage current in random access memory devices.

2. Description of the Related Art

Currently, semiconductor memory devices, such as dynamic random access memory (DRAM) devices, are widely used as solid storage media in low-cost digital devices, such as personal computers, cellular phones and personal digital assistants. Generally, a DRAM memory cell, which can store one bit of data, is composed of a transistor and a capacitor. FIG. 1 shows a DRAM memory cell 100 with a transistor 102 and a capacitor 104, wherein one end of the memory cell 100 is connected to the capacitor 104, and another end of the memory cell 100 is connected to a bit line BL. The control end of the memory cell 100 is connected to a word line WL. The bit of data is stored in the capacitor as electrical charges. Unfortunately, after a certain amount of time, the charges stored in the capacitor 104 are discharged through the substrate or other paths such that the stored data is lost. Accordingly, a periodic refresh operation is required to rewrite the stored data back to the memory cell 100.

To read the data stored in the memory cell 100, a sense amplification technique is applied. Typically, the bit line BL connected to the transistor 102 is connected to a sense amplifier along with another bit line BL'. The sense amplifier determines the data stored in the memory cell 100 by sensing the difference between the voltage on the bit line BL and the voltage on the bit line BL'. Accordingly, both bit lines BL and BL' need to be pre-charged to a high voltage in order for the sense amplification technique to be successfully applied. FIG. 2 shows a typical bit line pre-charge circuit applied in a DRAM device. As shown in FIG. 2, the bit line pre-charge circuit 200 comprises a first transistor 202 and a second transistor 204. The first transistor 202 connects a pre-charge voltage VEQ to the bit line BL. The second transistor 204 connects the pre-charge voltage VEQ to the bit line BL'. Both the first transistor 202 and the second transistor 204 are controlled by a pre-charge signal EQD. If the threshold voltages of the first transistor 202 and the second transistor 204 are not equal, the voltages on the bit line BL and the bit line BL' will not be equal. To overcome this defect, the bit line pre-charge circuit 200 can further comprises a third transistor 206 connecting the bit line BL and the bit line BL', wherein the third transistor 206 is also controlled by the pre-charge signal EQD.

To reduce power consumption, some DRAM devices can be operated in a self-refresh mode. While operating in a self-refresh mode, the DRAM device cannot be accessed, and a periodic self-refresh operation, performed internally and automatically, is required. FIG. 3 shows a timing diagram of the control signals of a typical DRAM device, wherein the DRAM device is in a self-refresh mode. As shown in FIG. 3, the refresh request is activated periodically, wherein the period is controlled by a timing counter. When a refresh is due, a refresh request is activated, and the refresh operation is performed during the refresh timing period of tCBR. After being refreshed, the pre-charge signal EQD of the corresponding cell is activated, while the pre-charge signal EQD of other cells are kept activated.

However, there are some drawbacks to continuously activating the pre-charge signal EQD. Particularly, bit line leakage currents may exist. Referring to FIG. 1, there may be a leakage current between the bit line BL and the word line WL through the inter dielectric. There may be another leakage current between the bit line BL and the word line WL through the gate oxide of the transistor 102. Yet another leakage current could occur between the bit line BL and the P well of the transistor 102 through the contact of the bit line BL. Accordingly, the standby current is increased due to the contribution of the bit line leakage currents. A current limiter may be utilized to reduce the bit line leakage currents. However, the bit line leakage currents cannot be fully eliminated. Therefore, there is a need to design a circuit and a method for controlling leakage current in random access memory devices.

SUMMARY OF THE INVENTION

The circuit for controlling leakage current in random access memory devices according to one embodiment of the present invention comprises a pre-charge equalization circuit. The pre-charge equalization circuit provides a pre-charge voltage to a pair of complementary bit lines of a memory cell of a random access memory device in accordance with a pre-charge signal. When the memory cell is in a self-refresh mode, the pre-charge signal is activated by a periodically triggered periodic pre-charge request and also activated before and after the memory cell is self-refreshed.

The method for controlling leakage current in random access memory devices according to one embodiment of the present invention comprises the steps of: continuously deactivating a pre-charge equalization circuit providing a pre-charge voltage to a pair of complementary bit lines of a memory cell of a random access memory device if the memory cell is in a self-refresh mode; temporarily activating the pre-charge equalization circuit before and after the memory cell is refreshed if the memory cell is in the self-refresh mode; and periodically activating the pre-charge equalization circuit if the memory cell is in the self-refresh mode.

The foregoing has outlined rather broadly the features and technical advantages of the present invention in order that the detailed description of the invention that follows may be better understood. Additional features and advantages of the invention will be described herein, and form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The objectives and advantages of the present invention will become apparent upon reading the following description and upon referring to the accompanying drawings of which.

DETAILED DESCRIPTION OF THE INVENTION

Figure 1:
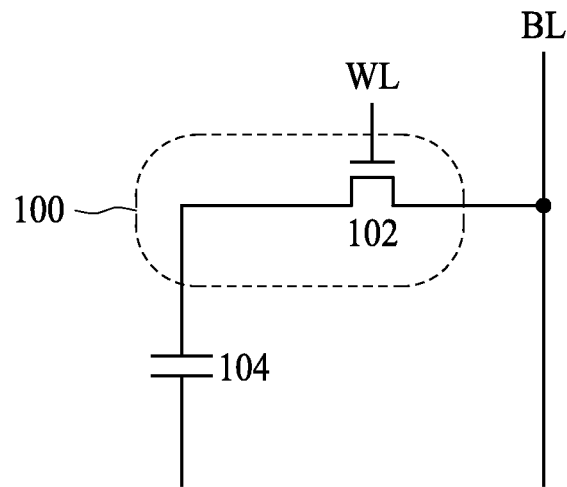
FIG. 1 shows a typical DRAM memory cell.
Figure 2:
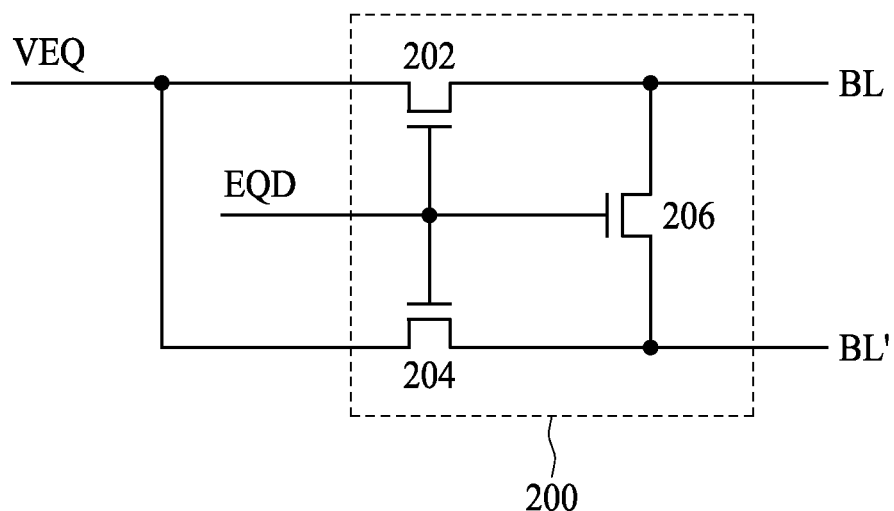
FIG. 2 shows a typical bit line pre-charge circuit applied in a DRAM device.
Figure 3:
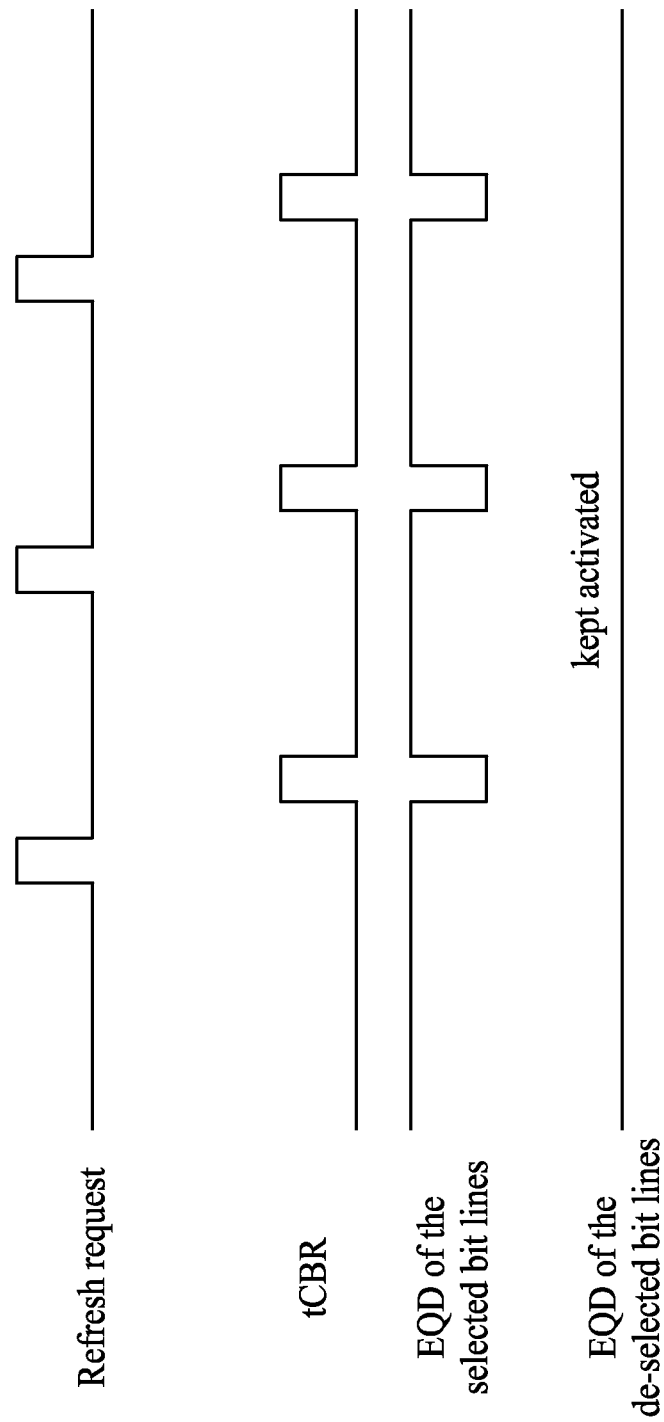
FIG. 3 shows a timing diagram of the control signals of a typical DRAM device.
Figure 4:
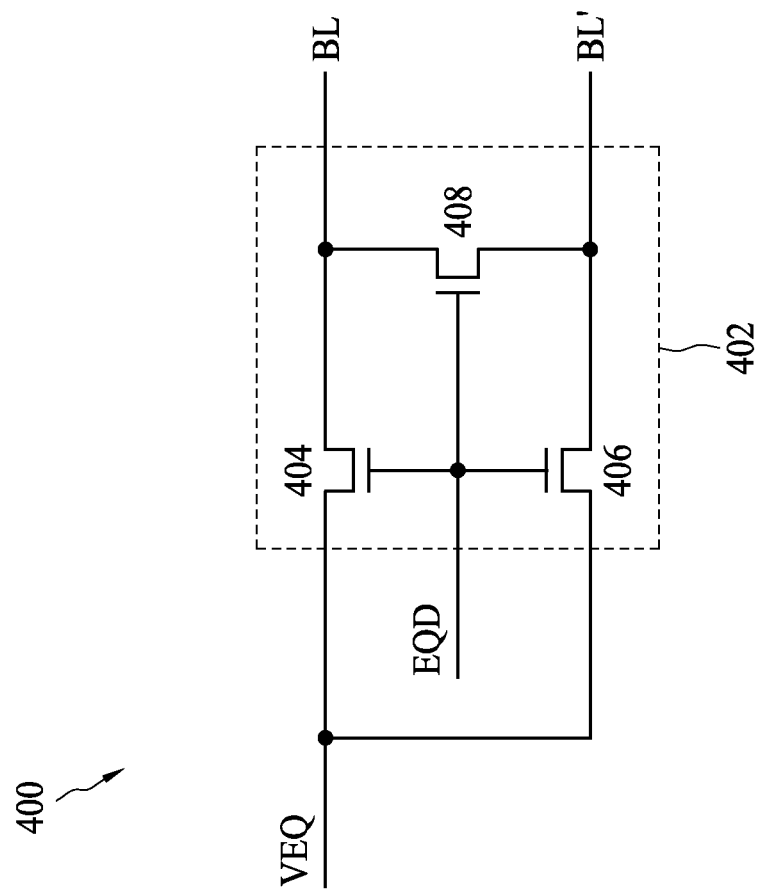
FIG. 4 shows a circuit for controlling leakage current in random access memory devices according to an embodiment of the present invention.

FIG. 4 shows a circuit 400 for controlling leakage current in random access memory devices according to an embodiment of the present invention. As shown in FIG. 4, the circuit 400 comprises a pre-charge equalization circuit 402 connected to a bit line BL and another bit line BL'. The pre-charge equalization circuit 402 comprises a first transistor 404, a second transistor 406 and a third transistor 408. The first transistor 404 connects a pre-charge voltage VEQ to the bit line BL. The second transistor 406 connects the pre-charge voltage VEQ to the bit line BL'. The third transistor 408 connects the bit line BL to the bit line BL'. A pre-charge signal EQD is used to control the first transistor 404, the second transistor 406 and the third transistor 408.

Figure 5:
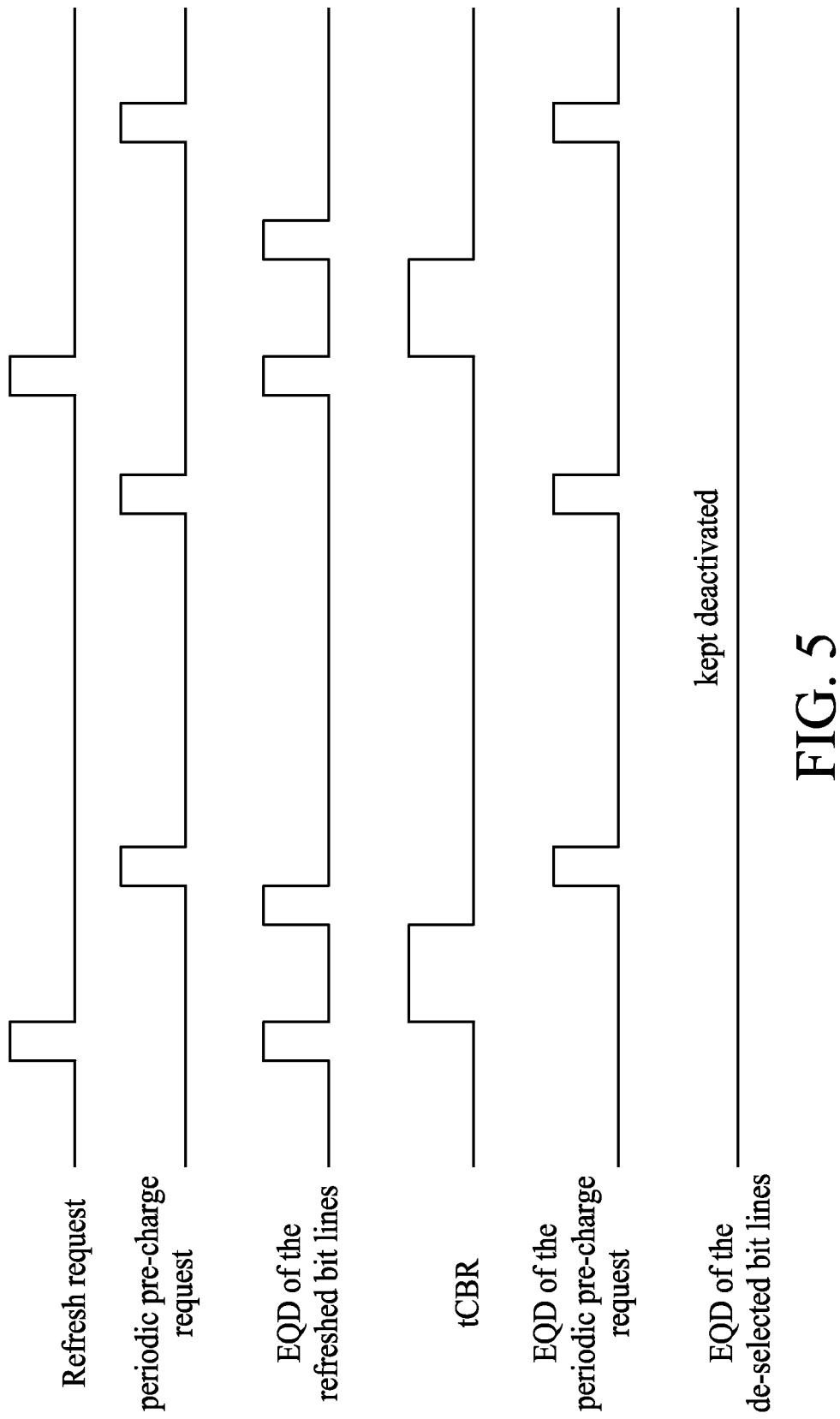
FIG. 5 shows a timing diagram of the control signals when applying a circuit for controlling leakage current in random access memory devices to a DRAM memory device according to an embodiment of the present invention.

FIG. 5 shows a timing diagram of the control signals when applying the circuit 400 shown in FIG. 4 to a DRAM memory device according to an embodiment of the present invention, wherein the DRAM memory device is operated in a self-refresh mode. As shown in FIG. 5, a refresh request is activated periodically, wherein the period is controlled by a timing counter. When a refresh is due, a refresh request is activated, and the refresh operation is performed within the refresh timing window of tCBR. Before the refresh operation, a pre-charge signal EQD is activated corresponding to the section of the refreshed memory cells. In addition, after the refresh operation, another pre-charge signal EQD is activated corresponding to the section of the refreshed memory cells. Furthermore, the pre-charge request of the circuit 400 is also activated periodically. It can be seen from FIG. 5 that, unlike the method of the conventional DRAM memory device, the pre-charge signal EQD of the present invention is kept deactivated except when responding to the refresh request or a pre-charge request. That is, the pre-charge signal is activated periodically and also activated before and after the corresponding memory cell is refreshed. Preferably, the periodic pre-charge operation is performed in a section-wise manner. That is, the bit lines in a section are pre-charged simultaneously, and then the bit lines in another section are pre-charged simultaneously, and so on. The period of the periodically activated pre-charge signal is shorter than the period of the refresh operations of the DRAM memory device. Accordingly, if the memory cells in one section are not refreshed, or if the bit lines are not pre-charged, then the bit lines in this section are floating. In this way, the leakage paths of the bit line leakage currents can be eliminated. That is, the leakage current between a bit line and the corresponding word line through the inter dielectric, the leakage current between a bit line and the corresponding word line through the gate oxide of a transistor, and the leakage current between the a line BL and the corresponding P well of a transistor through the contact of the bit line BL can all be eliminated.

In some embodiments of the present invention, if an activation of a pre-charge signal corresponding to a bit line (due to the periodic pre-charge request) coincides with another activation of another pre-charge signal to the same bit line (due to a refresh operation of the bit line), then the activation of the pre-charge signal due to the periodic pre-charge request is omitted.

Figure 6:
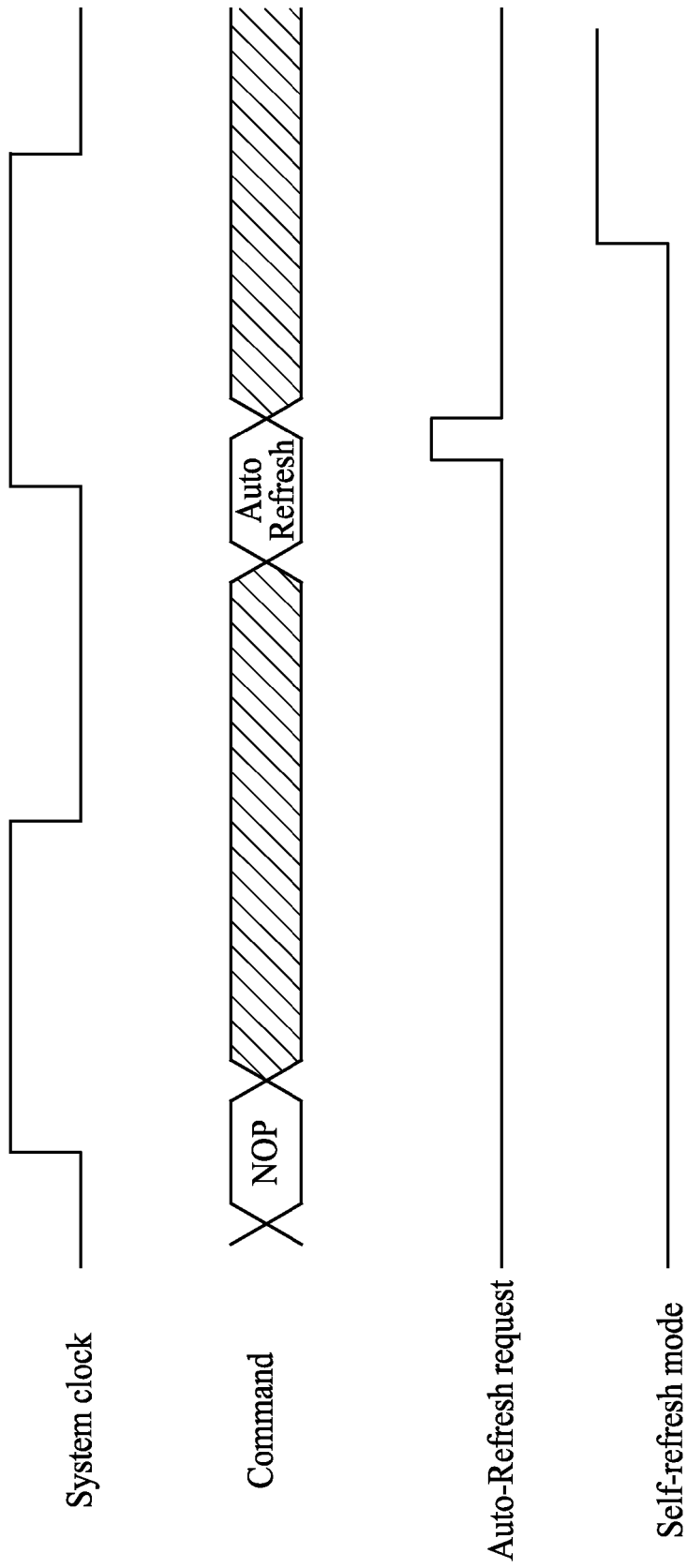
FIG. 6 shows a timing diagram of the control signals when a command for the memory cell to enter the self-refresh mode is triggered according to an embodiment of the present invention.

In some embodiments of the present invention, when a command for the memory cell to enter the self-refresh mode is triggered, an auto-refresh operation is executed before the memory cell enters the self-refresh mode. FIG. 6 shows a timing diagram of the control signals when a command for the memory cell to enter the self-refresh mode is triggered according to an embodiment of the present invention. According to a DRAM specification, when an auto-refresh command is triggered and the system clock signal is low, the DRAM device enters the self-refresh mode. In a conventional DRAM device, the DRAM device enters the self-refresh mode immediately after the command for the DRAM device to enter the self-refresh mode is triggered. However, since the clock rate of the clock signal of the DRAM device when it is in the self-refresh mode is much lower than that of the system clock when the DRAM device is in the normal mode, the refresh operation of the DRAM device is delayed a significant amount of time. In contrast, according to the embodiments of the present invention, an auto-refresh operation is executed before the DRAM device enters the self-refresh mode. In this way, the data stored in the DRAM device can be secured more properly.

Figure 7:
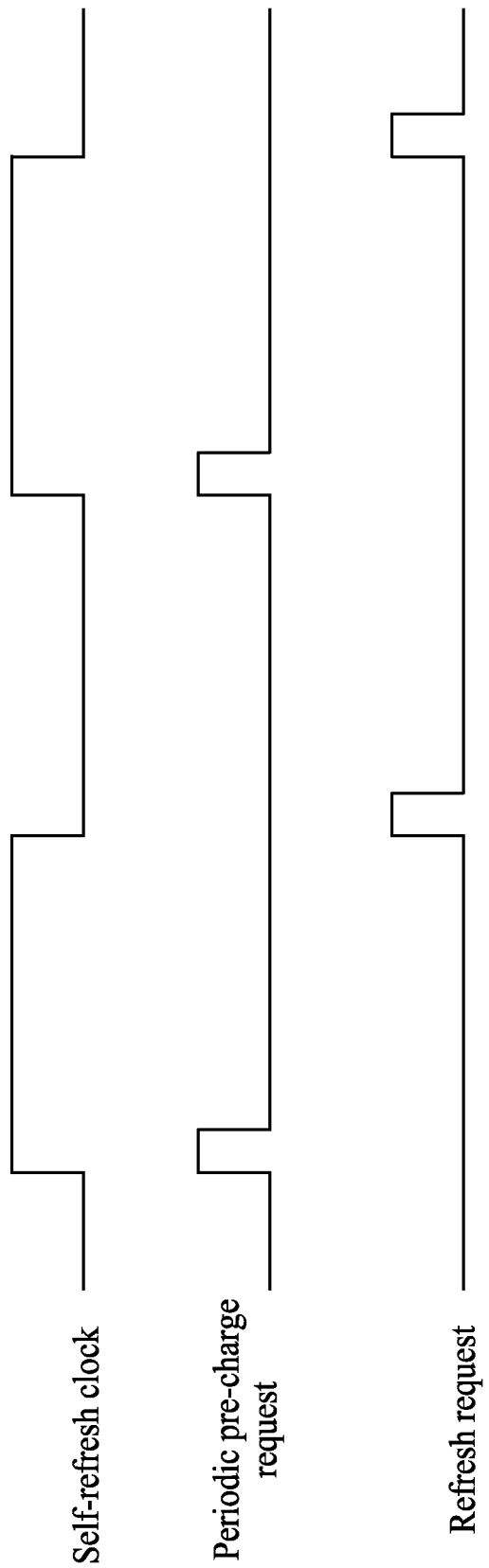
FIG. 7 shows a timing diagram of the control signals while the memory cell is in the self-refresh mode according to an embodiment of the present invention.

In some embodiments of the present invention, when the memory cell is in the self-refresh mode, the periodic pre-charge request is triggered by either the rising edge or the falling edge of a self-refresh clock signal, and the request for the self-refresh operation is triggered by the other of the rising edge and falling edge of the self-refresh clock signal. FIG. 7 shows a timing diagram of the control signals while the memory cell is in the self-refresh mode according to an embodiment of the present invention. As shown in FIG. 7, the periodic pre-charge request is triggered by the rising edge of the self-refresh clock signal SROSC. The request for the refresh operation is triggered by the falling edge of the self-refresh clock signal SROSC. In this embodiment, the clock rate of the self-refresh clock signal SROSC is much lower than the operation time of the periodic pre-charge operation and the refresh operation. Accordingly, the collision of the periodic pre-charge request and the refresh operation request can be avoided.

In some embodiments of the present invention, since the refresh operation is performed in bit-line wise, the periodic pre-charge operation is performed in section wise, and the period of the periodic pre-charge request is shorter than the period of the self-refresh operation of the memory cells, the memory cells to be periodically pre-charged and the memory cells to be refreshed are indicated by different clock circuits. Accordingly, while one section of a DRAM device is under a self-refresh operation, the other sections of the DRAM device undergo the periodic pre-charge operation several times.

Figure 8:
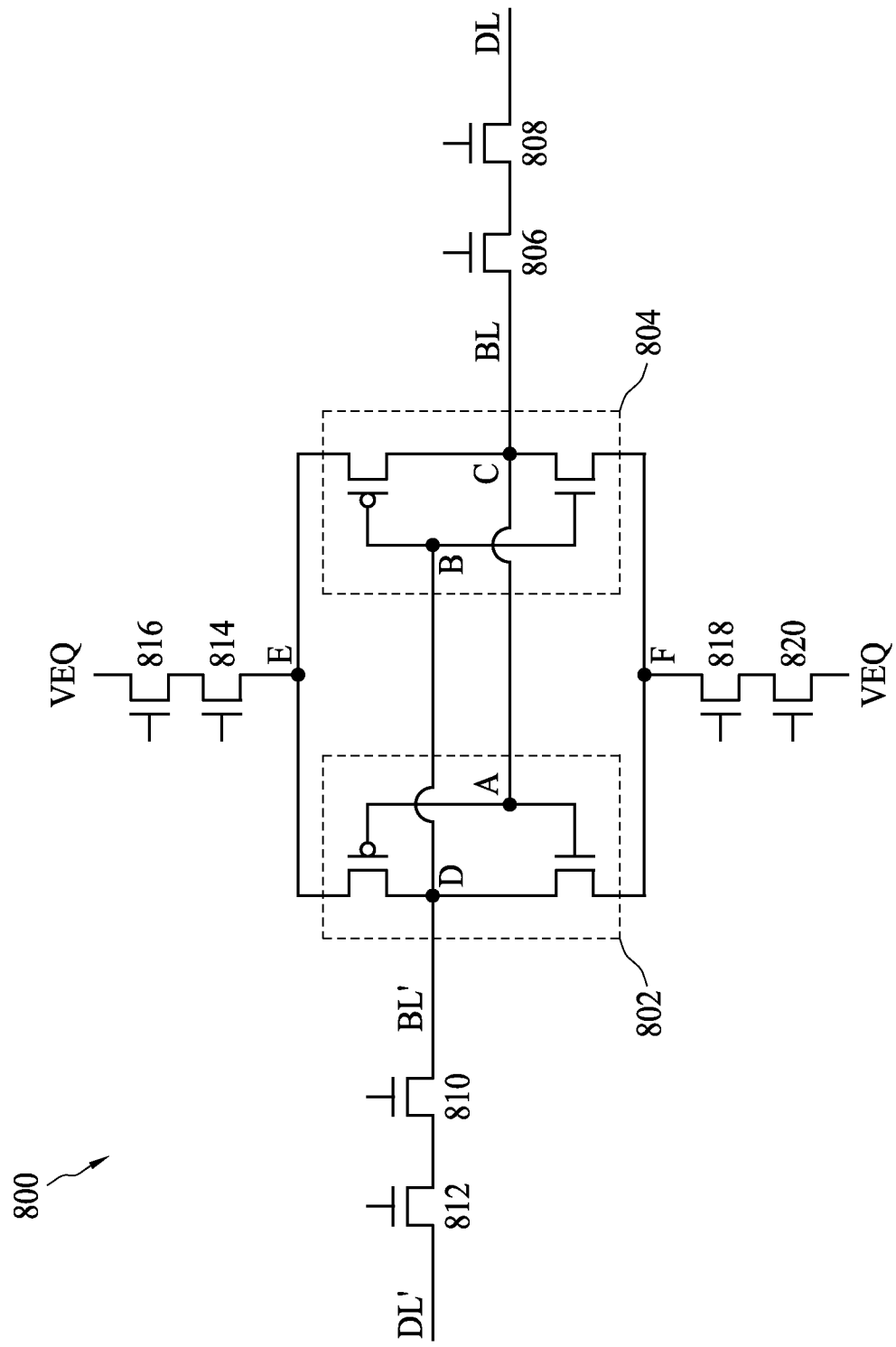
FIG. 8 shows a sense amplifier according to an embodiment of the present invention.

In some embodiments of the present invention, the circuit 400 for controlling leakage current in random access memory devices further comprises a sense amplifier 800 configured to sense the voltage difference between the pair of complementary bit lines BL and BL'. FIG. 8 shows the sense amplifier 800 according to an embodiment of the present invention. As shown in FIG. 8, the sense amplifier 800 comprises a first inverter 802, a second inverter 804, a first bit select transistor 806, a first isolation transistor 808, a second bit select transistor 810, a second isolation transistor 812, a first bit-line equalization transistor 814, a third isolation transistor 816, a second bit-line equalization transistor 818 and a fourth isolation transistor 820. The first inverter 802 and the second inverter 804 form the majority of the sense amplifier 800. A first input terminal A and a first output terminal C of the sense amplifier 800 are both connected to the bit-line BL. A second input terminal B and a second output terminal D of the sense amplifier 800 are both connected to the bit-line BL'. The first bit select transistor 806 is connected between the first output terminal C and a data line DL. The second bit select transistor 810 is connected between the second output terminal D and a data line DL'. Both the E and F are pre-charged to VEQ in conventional method. In this invention, they are disconnected from VEQ by following description. The first bit-line equalization transistor 814 is connected between the source voltage receiving terminal E of the sense amplifier 800 and the pre-charge voltage VEQ. The second bit-line equalization transistor 818 is connected between the ground voltage receiving terminal F of the sense amplifier 800 and the pre-charge voltage VEQ.

To prevent the current leakage between the bit-line BL and the data line DL, and the current leakage between the bit-line BL' and the data line DL', two isolation transistors 808 and 812 are also provided, wherein the first isolation transistor 808 is connected between the first bit select transistor 806 and the data line DL, and the second isolation transistor 812 is connected between the second bit select transistor 810 and the data line DL'. Accordingly, when the memory cell corresponding to the pair of complementary bit lines BL and BL' is in the self-refresh mode, the first isolation transistor 808 and the second isolation transistor 812 are not activated, and leakage currents can be prevented. A more detailed operation is as follows: when the memory cell corresponding to the pair of complementary bit lines BL and BL' is in the self-refresh mode, the control voltages of the first isolation transistor 808 and the second isolation transistor 812 are negative voltages to prevent the first isolation transistor 808 and the second isolation transistor 812 from being turned on, and when the memory cell corresponding to the pair of complementary bit lines BL and BL' is not in the self-refresh mode, the control voltages of the first isolation transistor 808 and the second isolation transistor 812 are positive voltages to turn on the first isolation transistor and the second isolation transistor.

To prevent the current leakage between the pre-charge voltage VEQ and the source voltage input terminal E, and the current leakage between the pre-charge voltage VEQ and the ground voltage input terminal F, two isolation transistors 816 and 820 are also provided, wherein the third isolation transistor 816 is connected between the pre-charge voltage VEQ and the source voltage input terminal E, and the fourth isolation transistor 820 is connected between the pre-charge voltage VEQ and the ground voltage input terminal F. Accordingly, when the memory cell corresponding to the pair of complementary bit lines BL and BL' is in the self-refresh mode, the third isolation transistor 816 and the fourth isolation transistor 820 are not activated, and leakage currents can be prevented. A more detailed operation is as follows: when the memory cell corresponding to the pair of complementary bit lines BL and BL' is in the self-refresh mode, the control voltages of the third isolation transistor 816 and the fourth isolation transistor 820 are negative voltages to prevent the third isolation transistor and the fourth isolation transistor from being turned on, and when the memory cell corresponding to the pair of complementary bit lines BL and BL' is not in the self-refresh mode, the control voltages of the third isolation transistor 816 and the fourth isolation transistor 820 are positive voltages to turn on the third isolation transistor 816 and the fourth isolation transistor 820.

In conclusion, the embodiments of the present invention utilize a periodic pre-charge technique such that the bit lines are provided with a pre-charge voltage only when the corresponding memory cells are periodically pre-charged or refreshed. Therefore, the bit lines are floating when the corresponding memory cells are not pre-charged or refreshed. Accordingly, the leakage current in random access memory devices can be controlled.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A circuit for controlling leakage current in random access memory devices, comprising:
a pre-charge equalization circuit, providing a pre-charge voltage to a pair of complementary bit lines of a memory cell of a random access memory device in accordance with a pre-charge signal;
wherein when the memory cell is in a self-refresh mode, the pre-charge signal is activated by a periodically triggered pre-charge request and is also activated, by a periodically triggered refresh request, before and after the memory cell is self-refreshed; and
wherein the period of the periodic pre-charge request is shorter than the period of the self-refresh operation of the memory cell.

2. The circuit of claim 1, wherein if an activation of the pre-charge signal due to the periodic pre-charge request coincides with another activation of the pre-charge signal due to a refresh operation of the memory cell, then the activation of the pre-charge signal due to the periodic pre-charge request is omitted.

3. The circuit of claim 1, wherein when a command for the memory cell to enter the self-refresh mode is triggered, an auto-refresh operation is executed before the memory cell enters the self-refresh mode.

4. The circuit of claim 1, wherein when the memory cell is in the self-refresh mode, the periodic pre-charge request is triggered by one of the rising edge and falling edge of a self-refresh clock signal, and the refresh request for the self-refresh operation is triggered by the other of the rising edge and falling edge of the self-refresh clock signal.

5. The circuit of claim 1, wherein the memory cells to be periodically pre-charged and the memory cells to be refreshed are indicated by different clock circuits.

6. The circuit of claim 1, further comprising:
a sense amplifier, configured to sense the voltage difference of the pair of complementary bit lines of the memory cell;
wherein a first output terminal of the sense amplifier is connected to one of a pair of complementary data lines via a first bit select transistor and a first isolation transistor, and a second output terminal of the sense amplifier is connected to the other one of the pair of complementary data lines via a second bit select transistor and a second isolation transistor;
wherein when the memory cell is in the self-refresh mode, the first isolation transistor and the second isolation transistor are not activated.

7. The circuit of claim 6, wherein when the memory cell is in the self-refresh mode, the control voltages of the first isolation transistor and the second isolation transistor are negative voltages to prevent the first isolation transistor and the second isolation transistor from being turned on, and when the memory cell is not in the self-refresh mode, the control voltages of the first isolation transistor and the second isolation transistor are positive voltages to turn on the first isolation transistor and the second isolation transistor.

8. The circuit of claim 6, wherein a source voltage input terminal of the sense amplifier is connected to the pre-charge voltage via a first bit-line equalization transistor and a third isolation transistor, a ground voltage input terminal of the sense amplifier is connected to the pre-charge voltage via a second bit-line equalization transistor and a fourth isolation transistor, and when the memory cell is in the self-refresh mode, the third isolation transistor and the fourth isolation transistor are not activated.

9. The circuit of claim 8, wherein when the memory cell is in the self-refresh mode, the control voltages of the third isolation transistor and the fourth isolation transistor are negative voltages to prevent the third isolation transistor and the fourth isolation transistor from being turned on, and when the memory cell is not in the self-refresh mode, the control voltages of the third isolation transistor and the fourth isolation transistor are positive voltages to turn on the third isolation transistor and the fourth isolation transistor.

10. The circuit of claim 1, wherein the random access memory device is a dynamic random access memory device.

11. A method for controlling leakage current in random access memory devices, comprising the steps of:
continuously deactivating a pre-charge equalization circuit providing a pre-charge voltage to a pair of complementary bit lines of a memory cell of a random access memory device if the memory cell is in a self-refresh mode;
temporarily activating the pre-charge equalization circuit before and after the memory cell is refreshed if the memory cell is in the self-refresh mode; and
periodically activating the pre-charge equalization circuit if the memory cell is in the self-refresh mode
wherein the period of the periodically activating step is shorter than the period of the refresh operations of the memory cell.

12. The method of claim 11, wherein if the periodically activating step coincides with the temporarily activating step, then the periodically activating step is omitted.

13. The method of claim 11, further comprising a step of:
performing an auto-refresh operation after a command for the memory cell to enter the self-refresh mode is triggered and before the memory cell enters the self-refresh mode.

14. The method of claim 11, wherein the periodically activating step is triggered by one of the rising edge and falling edge of a self-refresh clock signal, and the temporarily activating step is triggered by the other of the rising edge and falling edge of the self-refresh clock signal.

15. The method of claim 11, wherein the random access memory device is a dynamic random access memory device.

* * * * *